US011919050B2

(12) United States Patent
Weberbeck et al.

(10) Patent No.: US 11,919,050 B2
(45) Date of Patent: Mar. 5, 2024

(54) TEST SYSTEM FOR OPTICALLY CHECKING OF AN ELECTRICAL LINE

(71) Applicant: Lisa Draexlmaier GmbH, Vilsbiburg (DE)

(72) Inventors: Linus Weberbeck, Vilsbiburg (DE); Manuel Kagerhuber, Gangkofen (DE)

(73) Assignee: LISA DRÄXLMAIER GMBH, Vilsbiburg (DE)

( * ) Notice: Subject to any disclaimer, the term of this patent is extended or adjusted under 35 U.S.C. 154(b) by 565 days.

(21) Appl. No.: 17/114,775

(22) Filed: Dec. 8, 2020

(65) Prior Publication Data

US 2021/0187564 A1    Jun. 24, 2021

(30) Foreign Application Priority Data

Dec. 19, 2019    (DE) .......................... 102019135129.4

(51) Int. Cl.
| | |
|---|---|
| *B08B 5/02* | (2006.01) |
| *B08B 5/04* | (2006.01) |
| *B08B 13/00* | (2006.01) |
| *G01R 31/58* | (2020.01) |
| *G02B 27/00* | (2006.01) |

(52) U.S. Cl.
CPC .................. *B08B 5/02* (2013.01); *B08B 5/04* (2013.01); *B08B 13/00* (2013.01); *G01R 31/58* (2020.01); *G02B 27/0006* (2013.01)

(58) Field of Classification Search
CPC .. B08B 5/02; B08B 5/04; B08B 13/00; G01R 31/58; G02B 27/0006; G01N 2201/022; G01N 21/952; G01N 21/15; G01N 2021/151

See application file for complete search history.

(56) References Cited

U.S. PATENT DOCUMENTS

| | | | | |
|---|---|---|---|---|
| 10,184,858 | B2 * | 1/2019 | Klein | ................... G01N 21/896 |
| 2004/0066505 | A1 * | 4/2004 | Berg | ..................... G01N 21/952 |
| | | | | 356/237.1 |

FOREIGN PATENT DOCUMENTS

| | | |
|---|---|---|
| DE | 4021487 A1 | 1/1992 |
| DE | 102015219978 B4 | 4/2017 |
| EP | 2674045 B1 | 12/2013 |

OTHER PUBLICATIONS

English Language Abstract of DE102015219978B4.
English Language Abstract of DE4021487A1.
English Language Abstract of EP2674045B1.
Office Action from the German Patent Office dated Sep. 21, 2020.

* cited by examiner

*Primary Examiner* — Feba Pothen
(74) *Attorney, Agent, or Firm* — BelayIP

(57) ABSTRACT

The disclosure relates to a test system for optically checking an electrical line, including a test area for arranging the electric line; a plurality of prisms surrounding the test area; a camera directed at the prisms, which is designed to optically detect the electric line arranged in the test area through the prisms from different sides; a shielding mechanism, the curved inner contour of which encloses the test area and the prisms at least in the radial direction; an air duct, which is at least indirectly connected to a nozzle directed towards the test area and which is designed to apply a cleaning air stream to at least some prism surfaces facing the test area and thereby to entrain dirt particles present on these prism surfaces; and further air ducts opening into an area of the inner contour of the shielding.

9 Claims, 8 Drawing Sheets

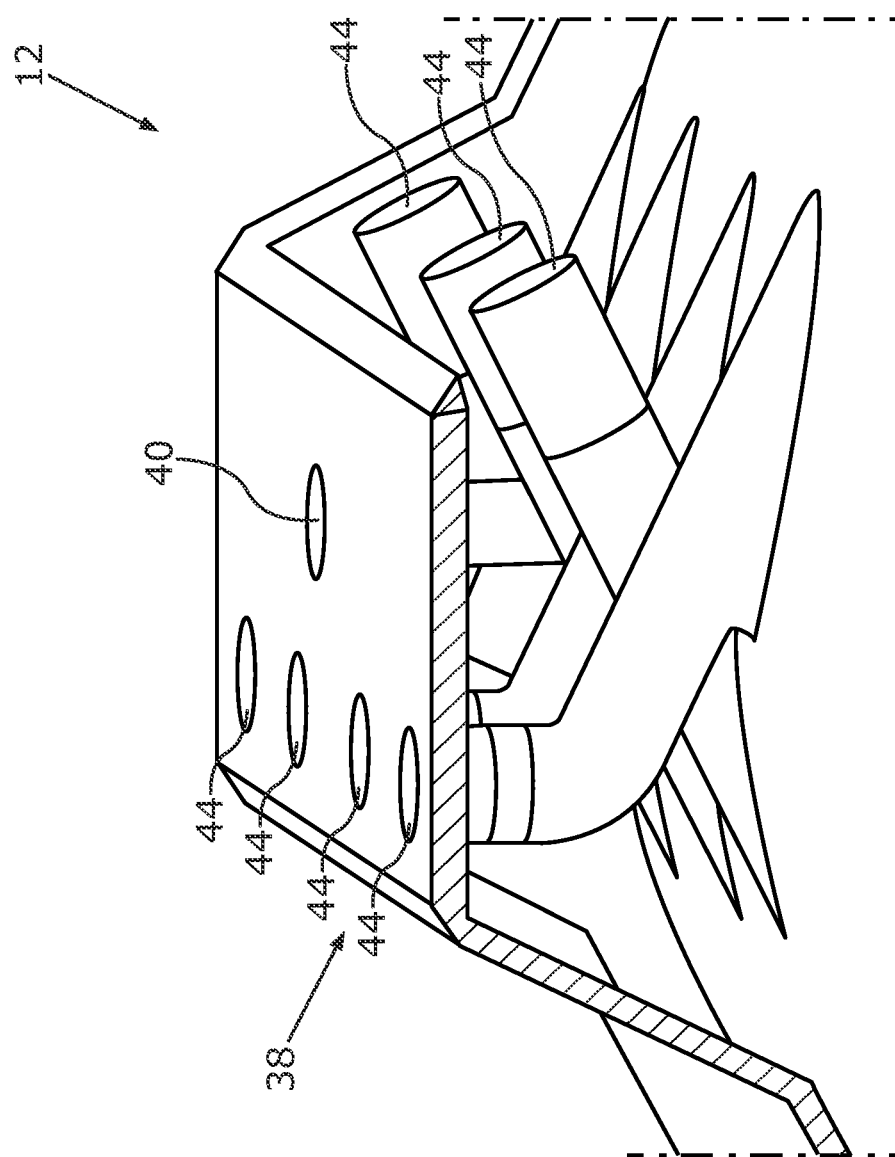

TEST SYSTEM FOR OPTICALLY CHECKING OF AN ELECTRICAL LINE

CROSS REFERENCE TO RELATED APPLICATIONS

This application is a claims priority to German Patent Application DE 102019135129.4 filed on Dec. 19, 2019. The contents of the above-referenced application is expressly incorporated herein by reference to their entireties.

BACKGROUND OF THE INVENTION

The present invention relates to a test system for optically checking an electric line.

For the quality inspection of electrical lines it is often necessary to inspect them from different sides and perspectives. For this purpose, test systems with optical aids and cameras can be used. A particular challenge in the application of such a test system for the optical checking an electrical line may be that particles of dirt from the electrical lines to be checked, such as broken shield litz wires or the like, repeatedly pollute the optical aids or cameras, making optical inspection more difficult.

BRIEF SUMMARY OF THE INVENTION

It is therefore the task of the invention to provide a solution by means of which a permanently reliable optical inspection of an electric line can be carried out in a particularly simple manner.

This task is solved by a test system for the optical checking of an electrical line with the features of claim 1. Further possible embodiments of the invention are indicated in particular in the dependent claims.

The test system for the optical checking an electric line according to the invention comprises a test area for arranging the electric line and several prisms surrounding the test area. Furthermore, the test system has a camera directed at the prisms, which is designed to optically detect the electrical line arranged in the test area through the prisms from different sides. The test system also includes a shielding mechanism whose curved inner contour encloses the test area and the prisms at least in the radial direction. The test system further comprises an air duct which is at least indirectly connected to a nozzle directed towards the test area and which is designed to apply a cleaning air flow to at least some of the prism surfaces facing the test area and thereby entrain dirt particles present on these prism surfaces. For example, the nozzle can be directed at the test area from above. Furthermore, the test system has further air ducts opening into an area of the inner contour of the shielding mechanism, which are designed to impinge on the inner contour of the shielding mechanism in two opposite peripheral directions, which direct the cleaning air flow together with the carried dirt particles into an air outlet in a lower region of the inner contour of the shielding mechanism. The other air ducts can, for example, lead into an upper area of the inner contour.

Instead of applying a negative pressure to the dirt particles from the prism surfaces facing the test area, the test system according to the invention is designed to entrain and thus remove the prism surfaces by applying the cleaning air flow. Particularly, if the installation space at the location to be cleaned is limited, it may not be possible to provide sufficient air ducts that would allow enough air flow by means of negative pressure to develop a sufficient cleaning effect. In the solution according to the invention, it is also not only intended to simply blow on or blow off the contaminated areas, i. e. the prism surfaces mentioned. This is because this could simply move the torn away dirt particles to other parts of the test system, as a result of which other optical components, such as the camera, could be polluted. The shielding mechanism is designed in such a way that it does not completely shield the test area and prisms, as this could otherwise affect the test system, for example through reflections.

Instead of simply vacuuming away the entrained or whirled-up dirt particles, the test system according to the invention is designed to apply the said entrained air flows to the inner contour of the shielding mechanism via the air channels opening into the area of the inner contour of the shielding mechanism, whereby the dirt particles are transported in the direction of the air diffuser or outlet in the lower area of the inner contour of the shielding mechanism. If, on the other hand, the dirt particles removed or entrained by the prism surfaces were to be removed by suction, an enormous volume flow with correspondingly large air flow cross-sections and/or a large number of suction points would be necessary. The latter in particular would be unfavourable in terms of flow. Also, with the test system according to the invention, it is not necessary to provide an air curtain around the extraction point, i. e. around the test area and the prisms.

Via the aforementioned nozzle it is therefore possible to apply the cleaning air flow to at least some of the prism surfaces facing the test area and thus to free the prism surfaces from existing dirt particles. The dirt particles thus picked up or entrained by the cleaning air flow are entrained together with the cleaning air flow through the carrying air flows, at least substantially completely following the inner contour of the shielding mechanism until the air flows along with the dirt particles leave the test system via the said air diffuser or outlet in the lower area of the inner contour of the shielding mechanism.

In particular, the test system according to the invention also makes it possible to automate the cleaning of the test system without having to significantly interrupt test cycles. The test system according to the invention does not even need to be opened for the cleaning of said prism surfaces and/or the test area. Interruptions to testing or production are therefore not necessary during the cleaning processes with the test system according to the invention.

Otherwise, any damage or misalignment of the test system that may otherwise occur during manual cleaning can also be reliably prevented. By shaping the curved inner contour of the shielding mechanism and by designing the air ducts, it is possible to realize an at least essentially laminar flow of the entrained air streams along the inner contour of the shielding mechanism. Due to the laminar design of the entraining air flows, it is possible to reliably direct the dirt particles, whirled up or removed by the cleaning air flow, in the direction of the air diffuser or outlet in the lower area of the inner contour of the shielding mechanism. The laminar flow prevents turbulence that would otherwise allow the removed or swirled up dirt particles to leave the shielding mechanism in the direction of the interior of the test system.

All in all, the test system according to the invention provides a particularly simple and effective means of removing dirt particles from the test system, in particular from the prisms, if necessary, without depositing these dirt particles in other areas of the test system, such as on the camera.

A possible design of the invention provides that the inner contour of the shielding mechanism is at least essentially ring-shaped. This is a particularly reliable way of achieving a laminar flow in the entrained air flows so that there is little or no turbulence within the entrained air flows. This helps to reliably direct the dirt particles removed or whirled up from the prism surfaces by means of the cleaning air flow in the direction of the air diffuser or outlet in the lower area of the inner contour of the shielding mechanism.

A further embodiment of the present invention is that the air ducts are designed to supply the entrained air flows in a tangential direction into the inner contour of the shielding mechanism. This is a particularly reliable way of ensuring that the entrained air flows in a circumferential direction along the inner contour of the shielding mechanism, so that at least a substantially laminar flow of the entrained air flows can be achieved. This also helps to prevent turbulence within the entrained air flows, as a result of which the dirt particles entrained by the cleaning air flow can be directed particularly reliably in the direction of the air diffuser or outlet in the lower area of the inner contour of the shielding mechanism.

According to another possible design of the invention, it is intended that the inner contour has a raised edge to prevent the entraining air flows of the cleaning air stream from leaving the shielding mechanism except through the air diffuser or outlet. In particular in the direction of the camera, the edge is designed so high or large that the camera can still reliably optically detect the electrical line located in this area through the prisms from different sides. If this requirement is met, the edge is designed so large that the air flows and in particular the entrained dirt particles cannot leave the shielding mechanism beyond the edge. This ensures that the dirt particles do not get to undesirable places in the test system.

According to another possible design of the invention, it is intended that the test system shall include a conveying device designed to set a larger volumetric flow rate for the entraining air flows than for the cleaning air flow. With the conveyor system, it is possible in particular to adjust the respective volumetric flows for the entrainment air flows and the cleaning air flow in such a way that a particularly good cleaning effect is achieved. This means in particular that, on the one hand, the said prism surfaces are reliably freed from the dirt particles present, while, on the other hand, it can be ensured that the entraining air flows are so strong and yet so laminar that the dirt particles whirled up or removed are reliably directed in the direction of the air diffuser or outlet in the lower area of the inner contour of the shielding mechanism. The cleaning air flow can be adjusted by means of the conveying device in such a way that dirt particles deposited on the prisms are blown away or blown off relatively easily, as a result of which they fall mainly downwards due to gravity, where they are then conveyed in the direction of the air diffuser or outlet by the entraining air flows.

Another possible design of the invention is that the test system is designed to automatically introduce the entrainment air flows and the cleaning air flow through the air ducts to clean the prisms. Without human intervention, it is possible, for example, to clean the test system automatically at fixed intervals or according to other criteria, i. e. in particular to free the prisms from any dirt particles. If the test system is integrated into a production line, the automatic cleaning of the prisms can be adapted to a production cycle, for example, so that no delays occur during production.

A further possible embodiment of the invention is that the test system has a suction device which is designed to apply a negative pressure at the air diffuser or outlet. As a result, the respective air flows together with the entrained dirt particles can be suctioned away particularly reliably through the air diffuser or outlet.

In a further possible embodiment of the invention, the air duct, which is at least indirectly connected to the nozzle directed towards the test area, opens into the same area of the inner contour of the shielding mechanism as the air ducts, which are designed to impinge the inner contour of the shielding mechanism with the entraining air flows in two opposite circumferential directions. Connection points for the supply of the entrainment air flow and the cleaning air flow can therefore be provided collectively in the same area of the shielding mechanism. A connection point of the nozzle, to which the air duct is at least indirectly connected, can for example be located near the area into which all air ducts flow. If the nozzle is positioned accordingly, the air duct connected to the nozzle can therefore be positioned particularly close to the nozzle, so that particularly low flow losses from the air duct to the nozzle occur.

Finally, a further possible embodiment of the invention is that the test system comprises an illuminating device accommodated by means of a holder for illuminating the test area, the nozzle being integrated into a component of the holder. By means of the illuminating device, the test area and the line to be tested can be illuminated, which may facilitate the testing of the line in question. The fact that the nozzle is integrated into a component of the holder means that the nozzle can be integrated into the test system in a particularly space-saving manner and without additional parts.

Further advantages, features and details of the invention may arise from the following description of possible design examples as well as from the drawings. The features and combinations of features mentioned above in the description as well as the features and combinations of features subsequently shown in the Figures description and/or in the Figures alone can be used not only in the combination indicated in each case, but also in other combinations or on their own without leaving the scope of the invention.

BRIEF DESCRIPTION OF THE SEVERAL VIEWS OF THE DRAWINGS

The drawing shows in:

FIG. 8 a partly cut detailed view of the other possible designs of the shielding mechanism, whereby different air ducts for the supply of air into the interior of the shielding mechanism are shown.

DETAILED DESCRIPTION OF THE INVENTION

In the Figures, identical or functionally identical elements are provided with the same reference signs.

Figure 1:
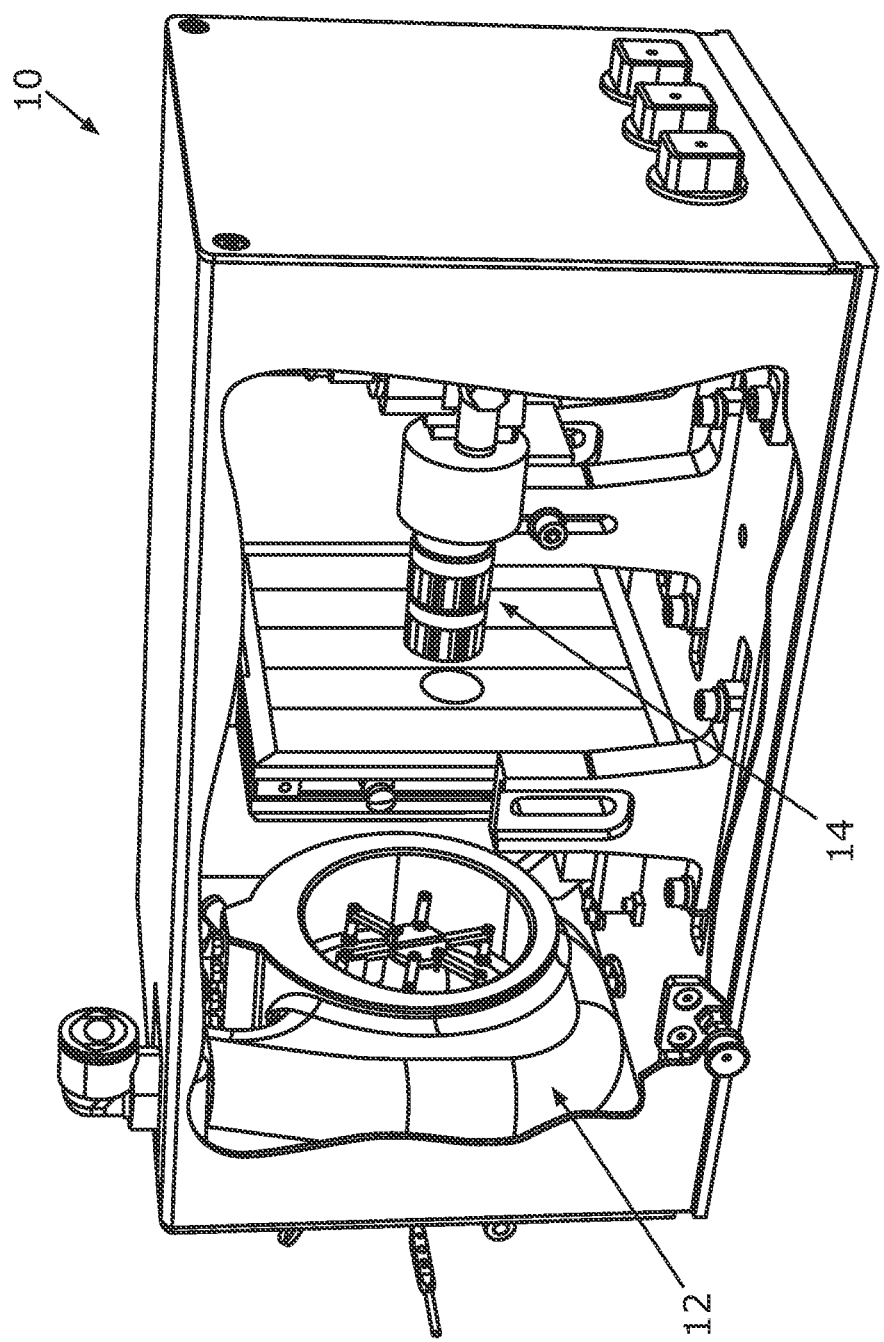
FIG. 1 a perspective view of a test system for the optical checking of an electrical line.

A test system 10 for the optically checking of an electrical line is shown in a perspective view in FIG. 1. Parts located inside the test system 10 are enclosed by a kind of box or housing.

wherein in the present representation a part of a side wall of the box or housing is omitted, so that the view into the interior of the test system 10 is enabled. Test system 10 comprises a substantially annular shielding mechanism 12 which encloses a test area that is not specified here and prisms not depicted in the Figure, particularly in the radial direction. The test system 10 comprises, among other things, a camera 14 directed at the prisms not depicted in the Figure, which is designed to optically detect the electrical line arranged in the test area through the prisms from different sides.

Figure 2:
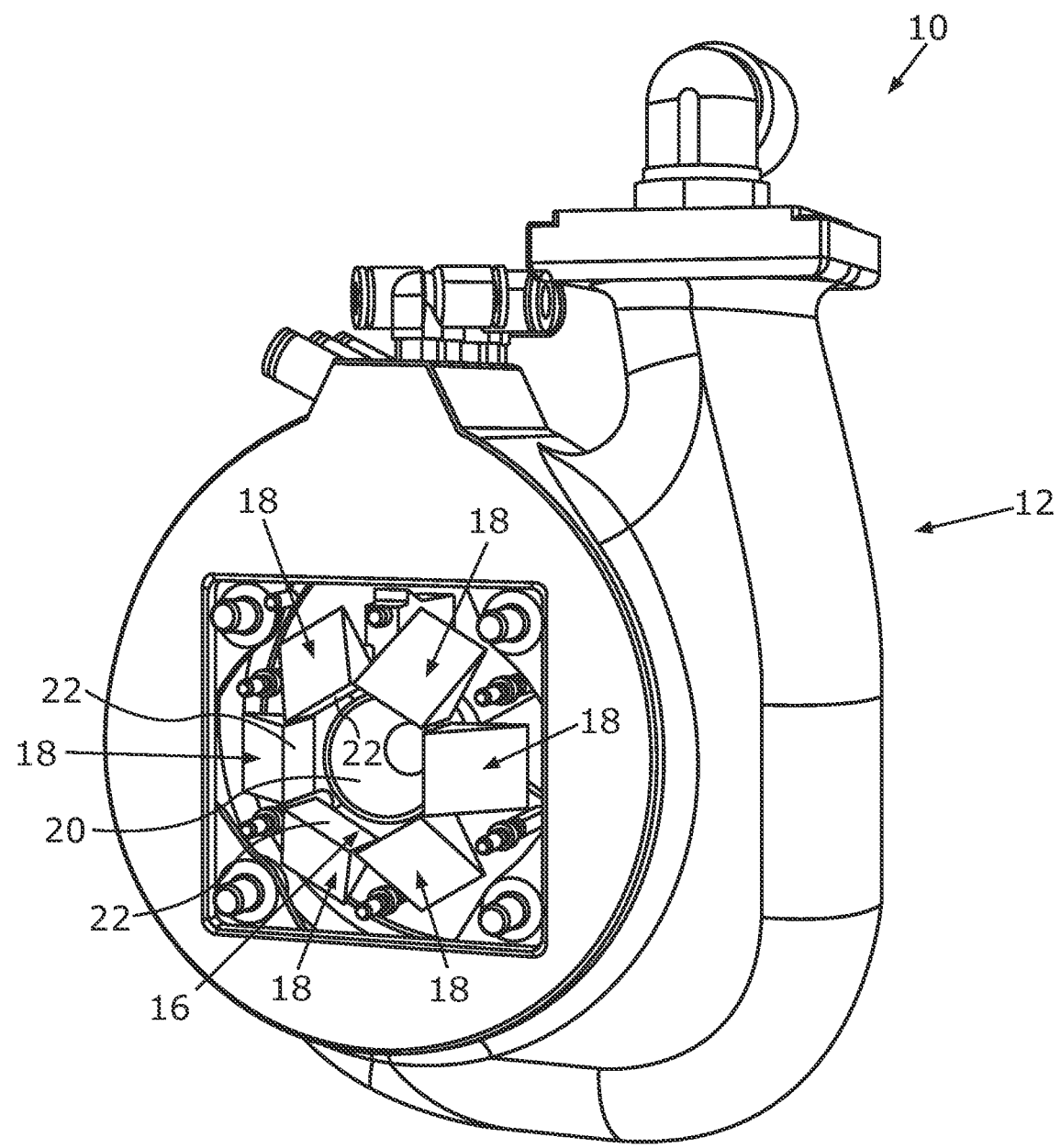
FIG. 2 a rear view of the partially depicted test system, showing a test area for arranging the electrical line as well as several prisms surrounding the test area.

In FIG. 2, the test system 10 is partly shown in a perspective rear view. By omitting some parts of the test system 10, the already mentioned test area 16 can be identified, in which the electrical cable can be arranged for optical inspection. The prisms 18, which surround the test area 16, can be seen. In addition, an illumination device 20 can also be seen, which is used to illuminate the test area 16 and the electrical line arranged therein, which is not shown here. Each prism face 22 is arranged in a ring around the test area 16 and directed towards it.

Figure 3:
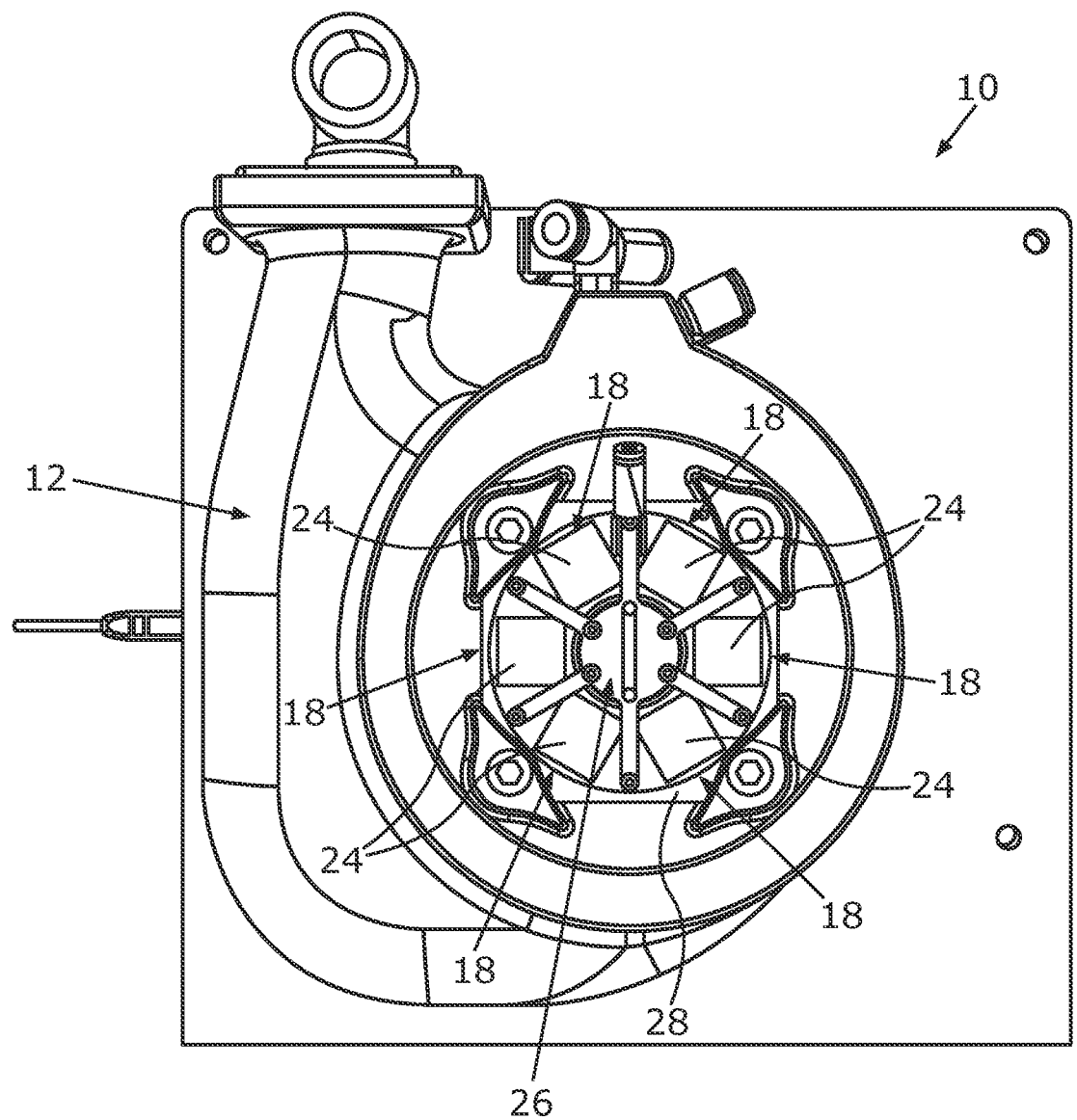
FIG. 3 a frontal view of a part of the test system, showing the arrangement of the prisms.

In FIG. 3 the test system 10 is partly shown in a frontal view, whereby the view of the prisms 18 is enabled. The camera 14 mentioned in connection with FIG. 1 looks at the perspective view shown here at the front sides 24 of the prisms 18. As a result, the camera 14 can optically detect the electrical line arranged in the test area 16 through the prisms 18 from different sides. Via the prism surfaces 22 (see FIG. 2) light beams are directed to the front sides 24 of the prisms 18, so that the camera 14 can optically detect the electrical line arranged in the test area 16 from different sides.

When the electrical line is arranged and checked, various particles of dirt may be deposited on the prism surfaces 22 (see FIG. 2), in particular on those prism surfaces 22 of the prisms 18 arranged below. For example, broken shielding litz wires, dust or other dirt particles can, in particular, get onto the lower prism surfaces 22. This can complicate the optical inspection of the electrical line. In the present illustration, a mount 26 can also be seen, by means of which in FIG. 2 the illuminating device 20 shown is held. Furthermore, a prism carrier 28 which serves to receive and hold the individual prisms 18 can also be seen.

Figure 4:
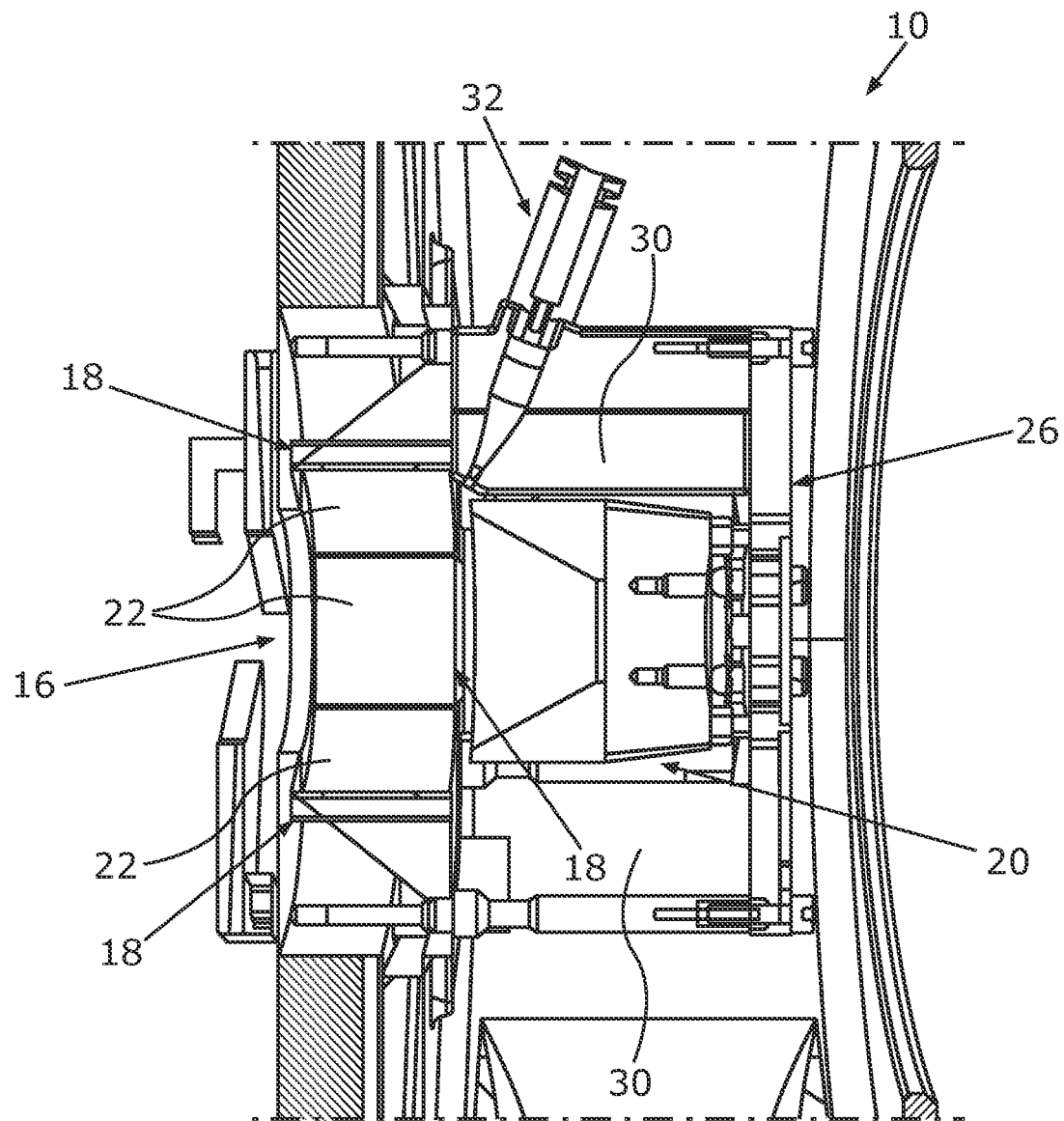
FIG. 4 a sectional side view of the test system in the area of the prisms, showing a nozzle directed at the test area and the prisms from above at an angle.

In FIG. 4, the test system 10 is shown in a partially cut side view in the area of the test area 16 and the prisms 18 as well as the illumination device 20. Some components 30 can be seen here, which are part of the mount 26 and serve to hold the illuminating device 20. A nozzle 32 is integrated into one of the components 30 of the mount 26 and the nozzle 32 is directed from an angle at the top to the lower prisms 18. The Nozzle 32 is used, in particular, to remove dirt particles from the prism surfaces 22 of the prisms 18 arranged below. A major challenge when blowing off such dirt particles is to prevent them from reaching other undesirable places in the test system 10, for example, a lens of the camera 14 or interfering with other optical elements or other components of the test system 10.

Figure 5:
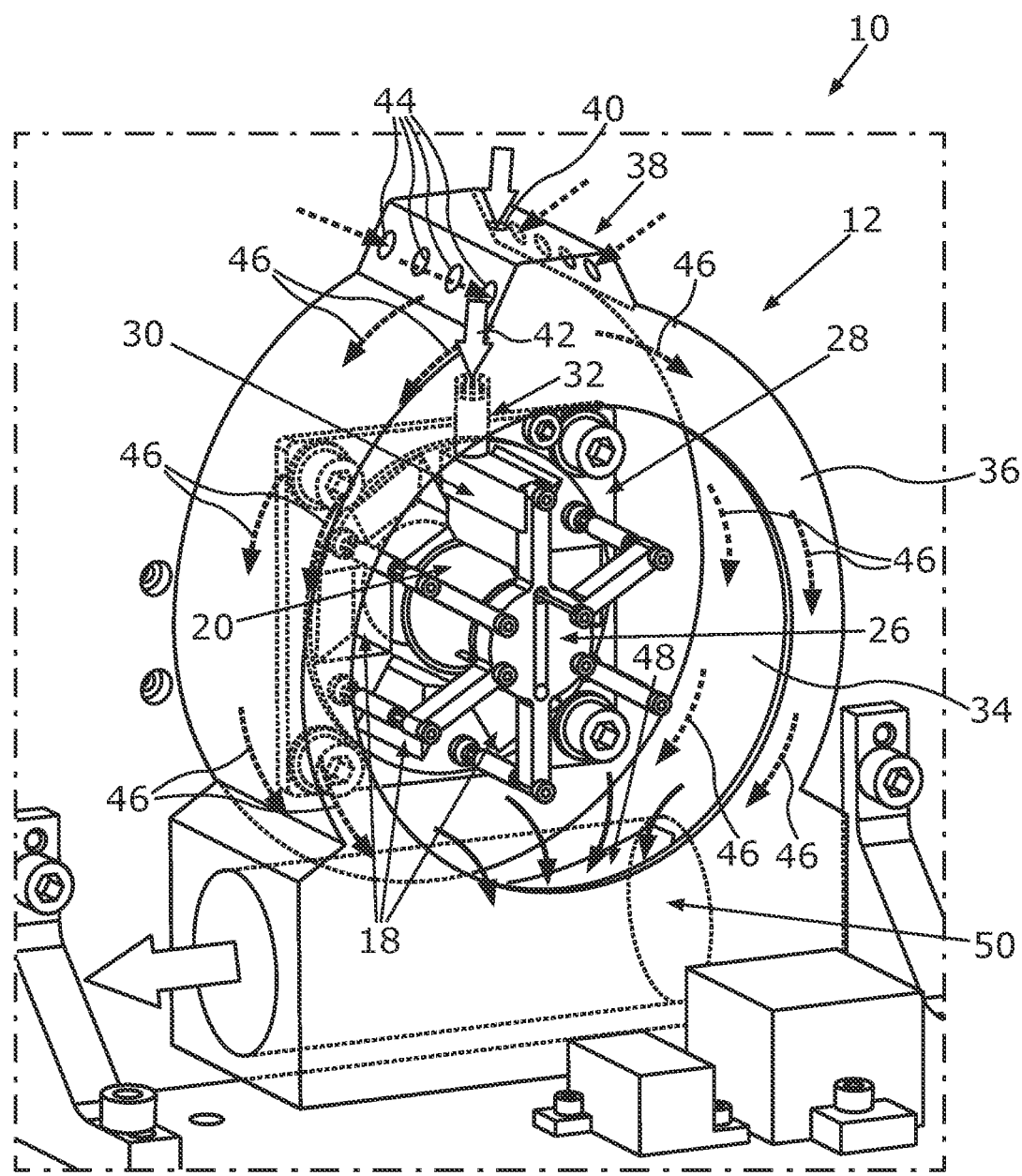
FIG. 5 a perspective view of a substantially annular shielding mechanism, the curved inner contour of which encloses the test area and the prisms, with different air flows schematically indicated.

In FIG. 5, the test system 10 is partly shown in a perspective view, wherein, in particular, the substantially annular shielding mechanism 12 can be seen, which surrounds the prisms 18 and the test area 16, which cannot be seen more closely here. A curved inner contour 34 of the shielding mechanism 12 surrounds the test area 16 and the prisms 18 in an annual manner. In addition, the shielding mechanism 12 has a raised edge 36. The raised edge 36 surrounds an opening not described in detail here, through which the camera 14 can look at the prisms 18 in the manner already described above and thus optically detect the electrical line from various sides.

In an upper region 38 of the shielding mechanism 12, an air duct 40 is provided, which extends at least substantially in the vertical direction and is connected at least indirectly to the nozzle 32 which is directed from above onto the test area 16 and which is designed to: in particular to apply a cleaning air flow schematically indicated by the arrows 42, to the prism surfaces 22 arranged below the test area 16 and thereby to entrain dirt particles present on these prism surfaces 22.

In the upper area 38 of the shielding mechanism 12, several further air ducts 44 are provided on opposite sides, which at least substantially and tangentially flow into the inner contour 34 of the shielding mechanism 12. The air ducts 44 are designed to impinge the inner contour 34 of the shielding mechanism 12 in two opposite circumferential directions with respective entraining air flows which are schematically indicated by the arrows 46.

So if the prism surfaces 22 (see FIG. 2 and FIG. 4) are impinged by the cleaning air flow 42 via the nozzle 32, dirt particles present on the lower prism surfaces 22, in particular, are removed or entrained by the cleaning air flow 42. As a result of gravity and flow, the entrained dirt particles carried along are not only transported downwards together with the cleaning air flow 42, but can also be deflected laterally in the direction of the inner contour 34 of the shielding mechanism 12. The entraining air flows 46 are so strong and above all also laminar that they direct the cleaning air flows 42 together with the entrained dirt particles into an air diffuser or outlet 48 in a lower area 50 of the inner contour 34 of the shielding mechanism 12. The raised edge 36 largely prevents the entraining air flows 46 and the cleaning air flow 42, together with the entrained dirt particles, from escaping from the shielding mechanism 12, except through the air diffuser or outlet 48.

The test system 10 may include a conveying device designed to adjust a higher volume flow rate for the entrainment air flows 46 than for the cleaning air flow 42. By means of the cleaning air flow 42, dirt particles can therefore be blown away relatively gently from the respective prism surfaces 22 without creating too much turbulence and the dirt particles not spreading too much and, in particular, leave the shielding mechanism 12 in undesired directions. The entrainment air flows 46 are adjusted with regard to their volume flow in such a way that they form a laminar flow along the inner contour 34 and are strong enough, to direct the dirt particles whirled up or entrained by the cleaning air stream 42 towards the air diffuser or outlet 48, through which the respective air flows 42, 46 and the dirt particles then leave the shielding mechanism 12 and ultimately also the test system 10. In particular, the test system 10 can also be designed to automatically introduce the entrainment air flows 46 and the cleaning air stream 42 for cleaning the prisms 18 through the respective air ducts 40, 44. The test system 10 may also have an extraction/suction device not shown here, which is designed to apply a negative pressure at air diffuser or outlet 48.

Figure 6:
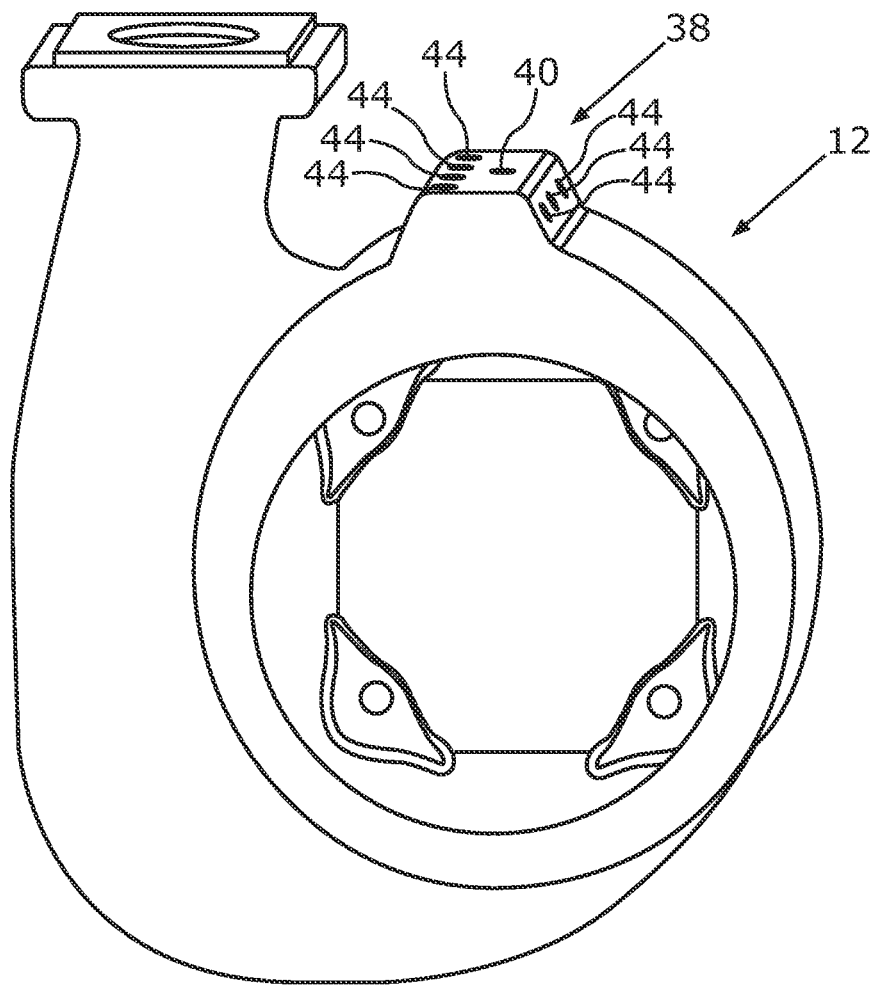
FIG. 6 a perspective view of another possible design of the shielding mechanism.

FIG. 6 shows a further possible embodiment of the shielding mechanism 12 in a perspective view. In the present case, the air ducts 44, which serve to guide the entrained air flows 46 not shown here to the inner contour 34 of the shielding mechanism 12. Furthermore, the air duct 40 is still visible, which extends substantially in a vertical direction downwards and can be at least indirectly connected to the nozzle 32 not shown here. The air ducts 40, 44 are again arranged in the upper area 38 of the shielding mechanism 12. A redirection of the outflow of the respective air flows 42, 46 can, as shown here, for example be upwards, due to installation space, but can also be in other directions.

Figure 7:
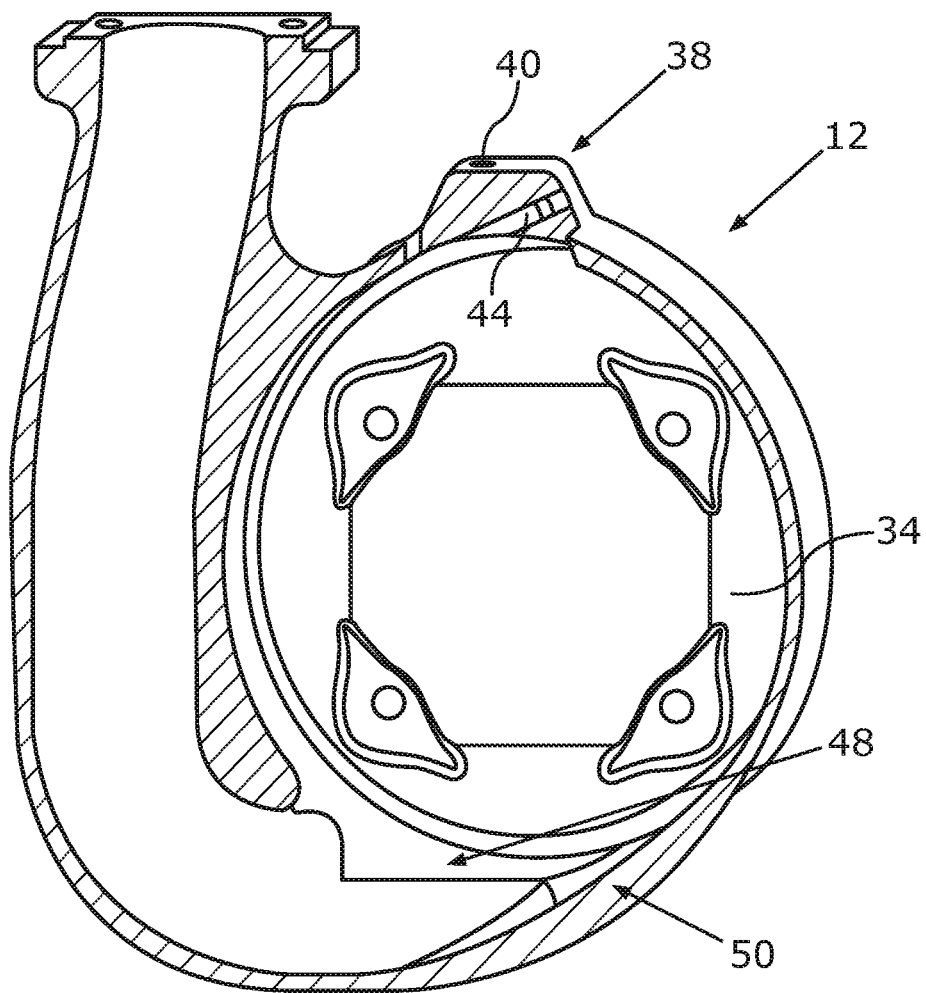
FIG. 7 a partially cut-out representation of the other possible designs of the shielding mechanism.

In FIG. 7 the further possible embodiment of the shielding mechanism 12 is shown in a partially cut view. In the present case, the substantially circular design of the inner contour 34 can again be clearly identified. In addition, one of the air ducts 44 can be identified in the upper area 38, which serves to introduce the entrained air flows 46 not marked here at least substantially in a tangential direction to the inner contour 34. The respective air ducts 44 are thus arranged at an angle so that the respective entrained air flows 46 are introduced tangentially following the curvature of the inner contour 34. As a result, the entraining air flows 46 can be formed as laminar flows so that no turbulence occurs within the entraining air flows 46 and the dirt particles that are whirled up or detached can be reliably directed towards the air diffuser or outlet 48 in the lower area of the inner contour 34 by means of the entraining air flows 46.

In FIG. 8 the further possible embodiment of the shielding mechanism 12 is shown in a detailed view. The arrangement and the course of the respective air ducts 40, 44 in the upper area 38 of the shielding mechanism 12 can again be clearly seen. Here it is again clearly seen that the air duct 40, which serves to supply the cleaning air flow 42, extends at least substantially in the vertical direction, wherein the air ducts 44, serving to supply the entraining air flows 46 run at an angle such that: the entraining air flows 46 flow laminarly along the inner contour 34 of the shielding mechanism 12.

The invention claimed is:

1. A test system for optically checking an electrical line, the test system comprising:
    a test area for arranging the electrical line;
    a plurality of prisms surrounding the test area;
    a camera directed at the prisms, the camera configured to optically detect the electrical line arranged in the test area through the prisms from different sides;
    a shielding mechanism having a curved inner contour which encloses the test area and the prisms at least in a radial direction;
    an air duct, at least indirectly connected to a nozzle directed towards the test area and designed to have at least some prism surfaces facing the test region with a cleaning air flow and thereby entrain dirt particles present on the at least some prism surfaces; and
    further air ducts arranged to open into an area of the inner contour of the shielding mechanism and configured to convey the inner contour of the shielding mechanism in two opposite circumferential directions with respective entraining air flows which direct the cleaning air flow together with the entrained dirt particles into an air diffuser or outlet in a lower region of the inner contour of the shielding mechanism.

2. The test system according to claim 1, wherein the inner contour of the shielding mechanism is at least substantially annular.

3. The test system according to claim 1, wherein the air ducts are configured to supply the entraining air flows open in a tangential direction into the inner contour of the shielding mechanism.

4. A test system according to claim 1, wherein the inner contour further comprises a raised edge arranged to prevent the entrainment airflows and the cleaning airflow from exiting the shielding mechanism except through the air diffuser or outlet.

5. The test system according to claim 1, wherein the test system further comprises a conveying device arranged and configured to set a greater volumetric flow rate for the entraining air flows than for the cleaning air flow.

6. The test system according to claim 1, wherein the test system is further configured to automatically introduce the entrainment air flows and the cleaning air flow for cleaning the prisms through the at least one of the entrainment air flows and the cleaning air flow.

7. The test system according to claim 1, wherein the test system further comprises a suction device arranged and configured to apply a negative pressure at the air diffuser or outlet.

8. The test system according to claim 1, wherein the air duct is at least indirectly connected to the nozzle directed towards the test area, is configured to open into a same area of the inner contour of the shielding mechanism as the air ducts which are designed to act on the inner contour of the shielding mechanism in two opposite circumferential directions with the driving air flows.

9. The test system according to claim 1, wherein the test system further comprises an illumination device arranged on a mount and configured to illuminate the test area, and wherein the nozzle is integrated into a component of the mount.

* * * * *